United States Patent
Shinagawa

[11] Patent Number: 5,886,371
[45] Date of Patent: Mar. 23, 1999

[54] INTEGRATED CIRCUIT WITH GATE-ARRAY INTERCONNECTIONS ROUTED OVER MEMORY AREA

[75] Inventor: Noriaki Shinagawa, Tokyo, Japan

[73] Assignee: Oki Electric Industry Co., Ltd., Tokyo, Japan

[21] Appl. No.: 804,258

[22] Filed: Feb. 21, 1997

[30] Foreign Application Priority Data

Feb. 22, 1996 [JP] Japan ................................ 8-034635

[51] Int. Cl.⁶ ................................................ H01L 27/10
[52] U.S. Cl. .................... 257/207; 257/208; 257/202; 257/211
[58] Field of Search .................... 257/207, 211, 257/208, 758, 202

[56] References Cited

U.S. PATENT DOCUMENTS 5,060,045  10/1991  Owada et al. .......................... 257/211
5,160,997  11/1992  Sandoh et al. .......................... 257/207
5,321,280   6/1994  Sakai ...................................... 257/211

FOREIGN PATENT DOCUMENTS 61-097849  5/1986  Japan.

*Primary Examiner*—Olik Chaudhuri
*Assistant Examiner*—Phat Y. Cao
*Attorney, Agent, or Firm*—Rabin & Champagne, P.C.

[57] ABSTRACT

In an integrated circuit combining a gate array with memory on a single semiconductor substrate, the interconnecting lines are routed in multiple metalization layers. In each layer having both memory and gate-array interconnecting lines, the memory interconnecting lines are routed over the memory area, and the gate-array interconnecting lines are routed in a different direction over the gate-array area. In layers having only gate-array interconnecting lines, some of these lines pass over the memory area, being routed directly above power-supply lines or shield lines provided in the layer just below.

12 Claims, 3 Drawing Sheets

INTEGRATED CIRCUIT WITH GATE-ARRAY INTERCONNECTIONS ROUTED OVER MEMORY AREA

BACKGROUND OF THE INVENTION

1. Field of the Invention

The present invention relates to an integrated circuit in which a gate array and memory are combined on the same semiconductor substrate, more particularly to the metalized interconnection pattern of such an integrated circuit.

2. Background Information

Integrating a gate array with memory is a known technology. The memory, which may be a read-only memory (ROM), random-access memory (RAM), or other type of memory, is typically surrounded by a sea of gates, which is a type of channelless gate array. The gates can be interconnected according to the customer's specifications to provide specialized logic functions together with memory in a single device.

The gates are interconnected by patterning multiple metal layers to form interconnection lines. At least three layers of metal interconnecting lines are normally used for the gate interconnections. The first two of these layers are also normally used for interconnections within the memory part of the device.

In conventional devices of this type, the metal interconnecting lines in each layer are all routed in the same direction, typically at right angles to the interconnecting lines in the next layer, and the metal interconnecting lines of the gate array are routed so as not to pass over the memory area. One reason why gate-array interconnections are not routed over memory circuits is to avoid memory malfunctions that might be caused by crosstalk from gate-array signal lines. Another reason is to avoid having the operating speed of the memory reduced by the increased capacitance that memory signal lines would acquire if they were to be paralleled by overlying gate-array interconnecting lines.

However, the conventional practice greatly constrains the routing of interconnecting lines in the gate array since all gate interconnections must avoid the forbidden zone above the memory. One undesirable result is that the routing process becomes difficult, requiring extra time and resources (human resources and computer resources), hence increasing the cost of designing the device. Another undesirable result is that the percentage of gates that can be utilized is reduced. This may force the customer either to curtail the logic functions implemented in the device, or to select a larger and more expensive device with more gates.

SUMMARY OF THE INVENTION

It is accordingly an object of the present invention to simplify the routing of metal interconnecting lines in an integrated circuit combining both memory and a logic current or gate array.

Another object of the invention is to improve the utilization of gates in such a device.

The invented integrated circuit according to an exemplary embodiment comprises a gate array and memory integrated on a single semiconductor substrate. Circuit elements in the gate array and memory are interconnected by multiple layers of metal signal lines and metal power-supply lines.

In a first layer of metal signal lines and power-supply lines, which is not necessarily the lowest layer, memory power-supply lines, and possibly memory signal lines, are routed in a first direction over the memory area, while gate-array signal lines and/or power-supply lines are routed in a second direction over the gate-array area.

In a second layer of metal signal lines and power-supply lines, disposed above the first layer, gate-array signal and/or power-supply lines are routed in the first direction. At least one gate-array signal line is routed directly over one of the memory power-supply lines in the first layer. The memory power-supply line shields the gate-array signal line from the memory below.

The second layer may also comprise shield lines routed in the second direction over the memory area, permitting additional gate-array signal lines in a third layer, disposed above the second layer, to be routed over the shield lines.

DETAILED DESCRIPTION OF THE INVENTION

Figure 1:
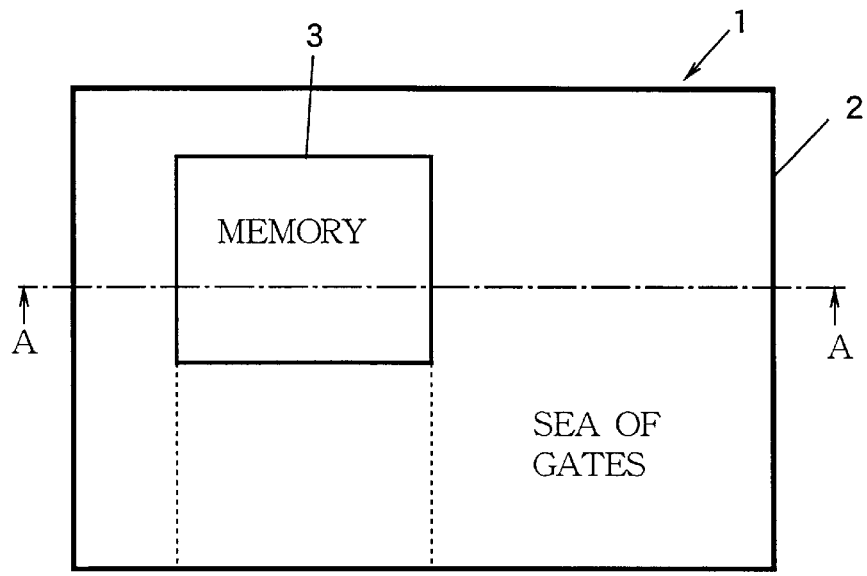
FIG. 1 is a plan view of the memory and gate-array areas in a first embodiment of the invention.

Embodiments of the invention will be described below with reference to the attached illustrative drawings. Identical elements in different drawings will be shown with identical reference numerals.

Interconnecting lines will be used hereinafter as a generic term denoting both signal lines and power-supply lines. Power-supply lines comprise, for example, both ground lines, and lines used to distribute a fixed power-supply potential different from the ground potential. All of the interconnecting lines referred to below are formed, for example, by a metalization process in which multiple layers of a metal, such as aluminum, are deposited on the integrated circuit and patterned by photolithography.

First Exemplary embodiment

The first embodiment has three layers of metal interconnecting lines. Memory interconnecting lines are routed in the first two layers. Gate-array interconnecting lines are routed in all three layers.

The restriction of memory interconnecting lines to the first two layers is not a significant design constraint. Two-layer interconnections are used for memory circuits in general. Due to the highly regular structure of memory circuits, a third layer of interconnections is usually unnecessary, and would not lead to much reduction in the size of the memory circuit even if present.

The structure of the first embodiment will be described by following the main steps in the exemplary metalization process.

Referring to FIG. 1, the metalization process starts from a semiconductor substrate 1 such as a silicon wafer. Normally a plurality of integrated circuits are formed simultaneously on the same wafer; FIG. 1 shows one of these integrated circuits. The integrated circuit comprises a sea of gates 2 surrounding a memory area 3. Transistors and other circuit elements have already been formed in the substrate 1 by well-known processes, which will therefore not be described here. The memory area 3 may comprise memory cells of any suitable type, such as ROM or RAM, for example, or both of these types.

Figure 2:
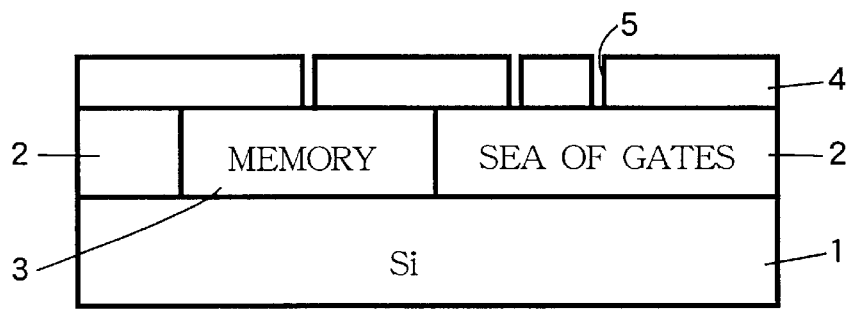
FIG. 2 is a sectional view through line A—A in FIG. 1.

The surface of the wafer is covered with an insulating layer 4, as shown in FIG. 2. Contact holes 5 are formed in this insulating layer 4 to provide access to the gates and memory cells in the sea of gates 2 and memory area 3, respectively.

Figure 3:
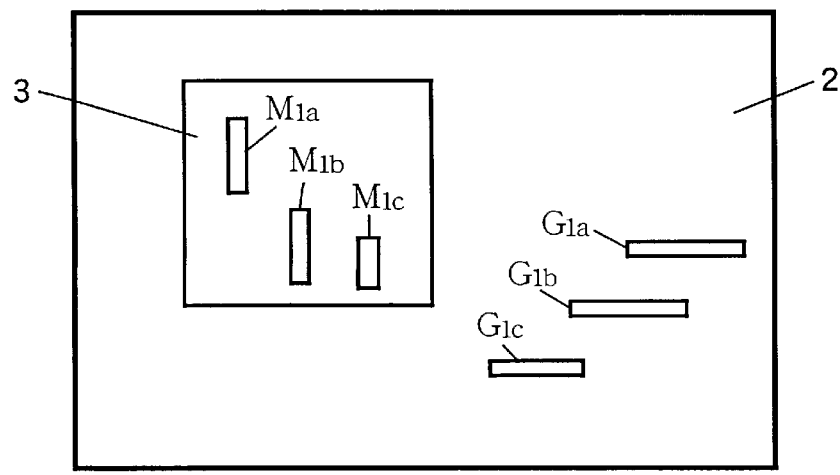
FIG. 3 is a plan view illustrating a first layer of metal interconnecting lines in the first embodiment.

A first layer of metal is deposited by sputtering aluminum, for example, onto the integrated circuit shown in FIGS. 1 and 2, and the metal is patterned by photolithography to form interconnecting lines. As examples of these interconnecting lines, FIG. 3 shows three memory interconnecting lines M1a, M1b, and M1c and three gate-array interconnecting lines G1a, G1b, and G1c. These interconnecting lines make electrical contact with the underlying circuit elements through the contact holes 5 shown in FIG. 2.

In this first layer of metal interconnecting lines, the memory interconnecting lines M1a–care routed over the memory area 3 in one direction (the vertical direction in the drawings), and the gate-array interconnecting lines G1a–care routed over the sea of gates 2 in the perpendicular direction (the horizontal direction in the drawings). No gate-array interconnecting lines are routed over the memory area 3.

Figure 4:
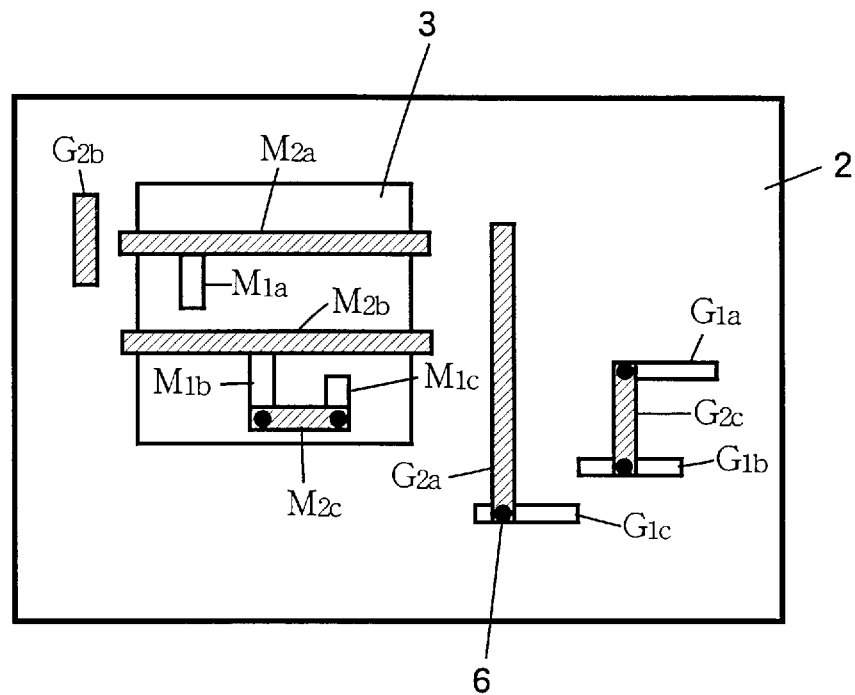
FIG. 4 is a plan view illustrating a second layer of metal interconnecting lines in the first embodiment.

Another insulating layer (not shown) is formed over the integrated circuit and interconnecting lines shown in FIG. 3, contact holes are opened in this layer, and a second layer of metal is deposited and patterned to create a second layer of interconnecting lines. FIG. 4 shows examples of memory power-supply lines M2a and M2b, a memory signal line M2c, and gate-array interconnecting lines G2a, G2b, and G2c in this second layer of metal interconnecting lines. Black dots indicate interconnections 6 between the first and second layers of interconnecting lines, made at contact holes in the intervening insulating layer.

The orientations of the gate-array and memory interconnecting lines in the second layer are reversed from the first layer: the memory interconnecting lines (M2a, M2b, M2c) are routed in the horizontal direction in FIG. 4 over the memory area 3, and the gate-array interconnecting lines (G2a, G2b, G2c) are routed horizontally over the sea of gates 2. No gate-array interconnecting lines are routed over the memory area 3.

Figure 5:
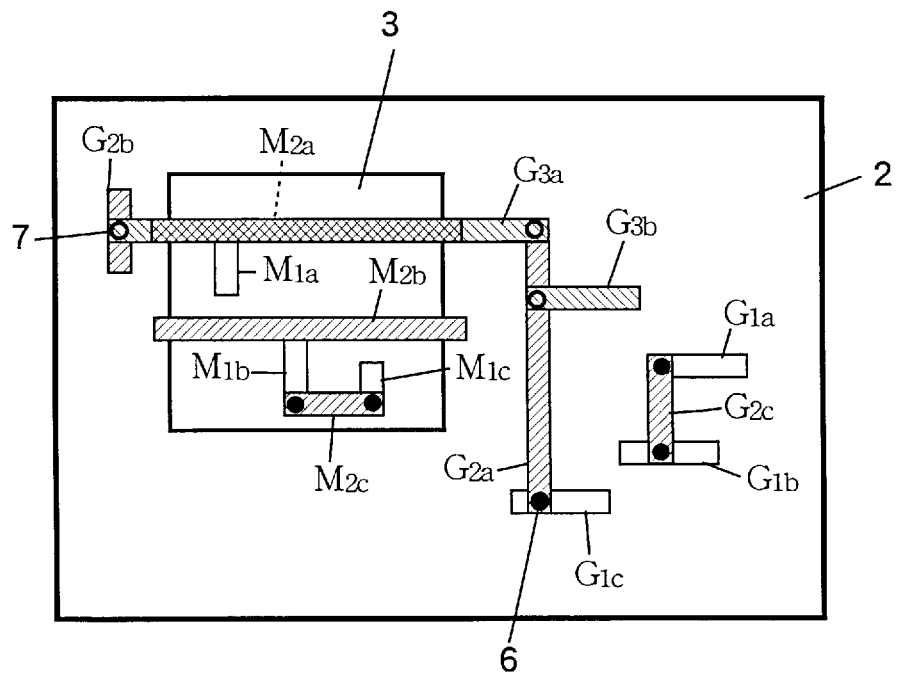
FIG. 5 is a plan view illustrating a third layer of metal interconnecting lines in the first embodiment.

Yet another insulating layer (not shown) is formed on the circuit shown in FIG. 4, contact holes are opened in this insulating layer, and a third layer of metal is deposited and patterned to form a third layer of interconnecting lines. FIG. 5 shows examples of gate-array interconnections G3a and G3b in this third layer of metal interconnecting lines. G3a is a signal line. There are no memory interconnecting lines in this layer. White dots indicate interconnections 7 between the second and third layers of interconnecting lines, made at contact holes in the intervening insulating layer.

The gate-array interconnecting lines in this layer (e.g. G3a and G3b) are all routed in the horizontal direction FIG. 5. Moreover, at least one gate-array signal line, (in this case signal line G3a) is routed directly over one of the memory power-supply lines (in this case M2a) in the second layer, thus passing over the memory area 3. Any number of gate-array signal lines may be routed over the memory area 3, provided they are routed directly over memory power-supply lines in this way. A gate-array signal line could also be routed over power-supply line M2b, for example.

To complete the device, the circuit shown in FIG. 5 is covered with still another insulating layer or passivation layer, in which additional contact holes are formed for connections to external circuits (not shown).

Although gate-array signal line G3a passes over the memory area 3, it is shielded from the memory area 3 by the power-supply line M2a, which is held at a fixed potential. Crosstalk from gate-array signal line G3a accordingly does not disrupt the operation of the memory circuit in memory area 3, and since interconnecting line M2a is a power-supply line, the increased capacitance due to the routing of signal line G3a just above interconnecting line M2a does not slow memory operations.

By permitting gate-array signal lines to be routed over the memory area 3, the first embodiment simplifies the routing step in the design process, and enables more gates in the sea of gates 2 to be utilized. In some cases this may enable the required logic functions to be implemented in a smaller and less expensive device than would otherwise be possible.

A further advantage of this embodiment is that the routing of third-layer signal lines such as G3a over second-layer interconnecting lines such as M2a simplifies the estimation of the capacitance of the third-layer signal lines, so that accurate capacitance values can be used when circuit operations are simulated during the verification step in the design process.

Second Exemplary embodiment

The second embodiment has four layers of metal interconnecting lines. Memory interconnecting lines are again routed in the first two layers as in the first exemplary embodiment. Gate-array interconnecting lines are routed in all four layers.

The first two layers of metal interconnecting lines are routed in the same way as in the first exemplary embodiment, so a description will be omitted.

Figure 6:
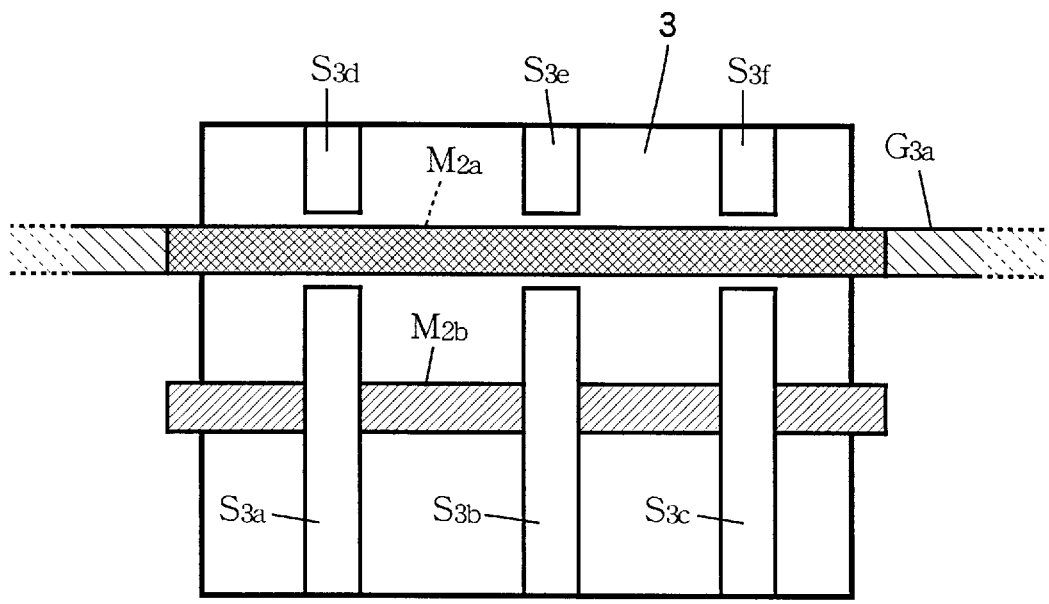
FIG. 6 is a plan view illustrating the third layer of metal interconnecting lines over the memory area in a second embodiment of the invention.

The third layer of metal interconnecting lines is routed as in the first exemplary embodiment, but the third layer also comprises shield lines, which are routed in the vertical direction over the memory area 3. FIG. 6 shows the memory area 3 with shield lines S3a to S3f. These shield lines are routed at right angles to the interconnecting lines such as G3a in the third layer, and do not make contact with any of the third-layer interconnecting lines. Each shield line may, however, be electrically connected through a contact hole (not visible) to a power-supply line in the second layer of metal interconnecting lines.

Figure 7:
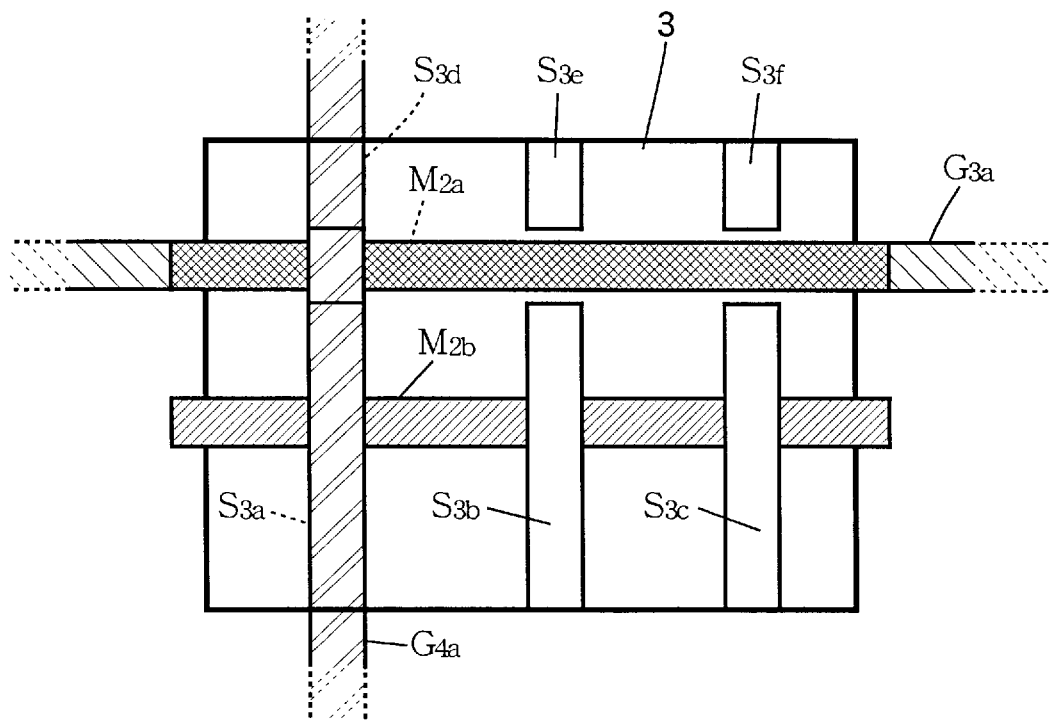
FIG. 7 is a plan view illustrating a fourth layer of metal interconnecting lines in the second embodiment.

An insulating layer (not visible) is formed on the circuit shown in FIG. 6, contact holes are opened, then a fourth layer of metal is deposited and patterned to form a fourth layer of interconnecting lines. FIG. 7 shows one of the gate-array signal lines G4a in this fourth layer. The fourth-layer interconnecting lines are routed in the vertical direction of FIG. 7.

As this drawing shows, fourth-layer gate-array signal lines (e.g. G4a) may pass over the memory area 3, provided they are routed over shield lines (e.g. S3a and S3d) in the third layer. Any number of fourth-layer signal lines may be routed in this way. A second gate-array signal line could be routed over shield lines S3b and S3e, for example, and a third over shield lines S3c and S3f.

Since the fourth-layer signal lines are shielded from the memory area 3 by the shield lines, crosstalk from these fourth-layer signal lines does not interfere with memory operation. Since the shield lines are routed at right angles to memory signal lines in the second layer, the shield lines do not greatly increase the capacitance of the memory signal lines, and the speed of memory operation is not significantly slowed.

The second exemplary embodiment provides the same advantages for a device with four-layer metalization as the first embodiment provided for a device with three layers: simplified routing, increased gate utilization, possibly smaller device size, and more accurate simulation.

The number of metal interconnecting lines used for memory interconnecting lines is not limited to two. In general there may be N layers of memory interconnecting lines, in which case gate-array signal lines in layer N+1 are routed over memory power-supply lines in layer N. If the gate array has more than N+1 layers of interconnecting lines, shield lines can be formed in layer N+1 over the memory area, and signal lines in layer N+2 can be routed over the shield lines as in the second embodiment.

If the gate array has more than N+2 layer of interconnecting lines, signal lines in each layer above layer N+2 can be routed over the memory area by providing shield lines in the layer just below. For example, shield lines can be provided in layer N+2 to permit signal lines in layer N+3 to pass over the memory area.

No restrictions are placed on the type of memory, type of gate array, or type of semiconductor substrate employed in the invention.

Those skilled in the art will recognize that further modifications are possible within the scope of the invention claimed below.

What is claimed is:

1. An integrated circuit in which a gate array and memory are integrated on a single semiconductor substrate, comprising:

a first layer of metal interconnecting lines having memory power-supply lines routed in a first direction over said memory, and gate-array interconnecting lines routed in a second direction, different from said first direction, over said gate array;

a second layer of metal interconnecting lines disposed above said first layer of metal interconnecting lines, having gate-array signal lines routed in said first direction, among which at least one gate-array signal line is routed parallel to and directly over one of the memory power-supply lines in said first layer of metal interconnecting lines; and at least one additional layer of metal interconnecting lines disposed below said first layer of metal interconnecting lines, having memory interconnecting lines routed in said second direction over said memory and gate-array interconnecting lines routed in said first direction over said gate array.

2. The integrated circuit of claim 1, wherein said first direction is perpendicular to said second direction.

3. The integrated circuit of claim 1, wherein said second layer of metal interconnecting lines also comprises shield lines routed in a third direction over said memory; and a shield lines are coupled to at least one of the power-supply lines in said first layer of metal interconnecting lines.

4. The method of claim 1, wherein the gate array is a logic circuit formed from an array of transistors, and the memory is a memory circuit formed from an array of memory cells for storing data.

5. An integrated circuit in which a gate array and memory are integrated on a single semiconductor substrate, comprising:

a first layer of metal interconnecting lines having memory power-supply lines routed in a first direction over said memory, and gate-array interconnecting lines routed in a second direction, different from said first direction, over said gate array;

a second layer of metal interconnecting lines disposed above said first layer of metal interconnecting lines, having gate-array signal lines routed in said first direction, among which at least one gate-array signal line is routed parallel to and directly over one of the memory power-supply lines in said first layer of metal interconnecting lines, wherein said second layer of metal interconnecting lines also includes shield lines routed in a third direction over said memory; and a third layer of metal interconnecting lines disposed above said second layer of metal interconnecting lines, having gate-array interconnecting lines routed in said third direction, among which at least one gate-array signal line is routed directly over one of said shield lines.

6. The integrated circuit of claim 5, wherein said third direction coincides with said second direction.

7. A method of routing metal interconnecting lines in an integrated circuit combining a gate array and memory on a single semiconductor substrate, comprising:

routing memory power-supply lines in a first direction over said memory in a first layer of metal interconnecting lines;

routing gate-array interconnecting lines in a second direction, different from said first direction, over said gate array in said first layer of metal interconnecting lines;

routing gate-array interconnecting lines in said first direction in a second layer of metal interconnecting lines, disposed above said first layer of metal interconnecting lines;

routing shield lines in a third direction above said memory in said second layer of metal interconnecting lines; and routing gate-array interconnecting lines in said third direction in a third layer of metal interconnecting lines disposed above said second layer of metal interconnecting lines; wherein among the gate-array interconnecting lines in said second layer of metal interconnecting lines there is at least one gate-array signal line that is routed parallel to and directly over one of said memory power-supply lines in said first layer of metal interconnecting lines; and among the gate-array interconnecting lines in said third layer of metal interconnecting lines there is at least one gate-array signal line that is routed directly over one of said shield lines in said second layer of metal interconnecting lines.

8. The method of claim 7, wherein said first direction is perpendicular to said second direction.

9. The method of claim 7, wherein said third direction coincides with said second direction.

10. The method of claim 7, wherein said shield lines are connected to at least one of the power-supply lines in said first layer of metal interconnecting lines.

11. The method of claim 7, further comprising:

routing memory interconnecting lines in said second direction over said memory in an additional layer of metal interconnecting lines disposed below said first layer of metal interconnecting lines; and routing gate-array interconnecting lines in said first direction over said gate array in said additional layer of metal interconnecting lines.

12. The method of claim 7, wherein the gate array is a logic circuit formed from an array of transistors, and the memory is a memory circuit formed from an array of memory cells for storing data.

* * * * *